United States Patent
Nakajima et al.

(10) Patent No.: US 6,297,443 B1
(45) Date of Patent: Oct. 2, 2001

(54) THIN FILM PHOTOELECTRIC TRANSDUCER

(75) Inventors: Akihiko Nakajima, Himeji; Masashi Yoshimi, Kobe; Takayuki Suzuki, Otsu; Kenji Yamamoto, Kobe, all of (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/269,400

(22) PCT Filed: Feb. 12, 1998

(86) PCT No.: PCT/JP98/00556
§ 371 Date: Mar. 26, 1999
§ 102(e) Date: Mar. 26, 1999

(87) PCT Pub. No.: WO99/10933
PCT Pub. Date: Mar. 4, 1999

(30) Foreign Application Priority Data
Aug. 21, 1997 (JP) .................................................. 9-242126

(51) Int. Cl.[7] .................... H01L 31/0368; H01L 31/0232
(52) U.S. Cl. ........................... 136/258; 136/255; 136/256
(58) Field of Search .................... 136/255, 256, 136/258, 252

(56) References Cited

U.S. PATENT DOCUMENTS

| | | | |
|---|---|---|---|
| 4,082,570 | * | 4/1978 | House et al. .......................... 136/89 |
| 4,160,045 | * | 7/1979 | Longshore ............................. 427/38 |
| 4,252,865 | * | 2/1981 | Gilbert et al. ........................ 428/611 |
| 4,433,202 | * | 2/1984 | Maruyama et al. .................. 136/255 |
| 4,500,743 | * | 2/1985 | Hayashi et al. ....................... 136/258 |
| 4,514,583 | * | 4/1985 | Teidje et al. .......................... 136/256 |
| 4,532,537 | * | 7/1985 | Kane ....................................... 357/30 |
| 4,608,451 | * | 8/1986 | Landis ................................... 136/256 |
| 4,808,462 | * | 2/1989 | Yaba et al. ............................ 428/142 |
| 5,244,509 | * | 9/1993 | Arao et al. ............................ 136/259 |
| 5,500,055 | * | 3/1996 | Toyama et al. ...................... 136/259 |
| 5,859,397 | * | 4/1978 | Ichinose et al. ................. 204/157.15 |

FOREIGN PATENT DOCUMENTS

| | | |
|---|---|---|
| 0113434 | 7/1984 | (EP) . |
| 0591949 | 4/1994 | (EP) . |
| 59-124772 | 7/1984 | (JP) . |
| 62-45079 | 2/1987 | (JP) . |
| 4334069 | 11/1992 | (JP) . |
| 6342923 | 12/1994 | (JP) . |
| 7122764 | 5/1995 | (JP) . |

OTHER PUBLICATIONS

Nakajima, Akihiko et al. *Solar Energy Materials and Solar Cells*, vol. 48, pp. 287–294, (1997).

* cited by examiner

*Primary Examiner*—Harold Pyon
*Assistant Examiner*—Michael C. Miggins
(74) *Attorney, Agent, or Firm*—Birch, Stewart, Kolasch & Birch, LLP (57) ABSTRACT

A thin film photoelectric converter includes a polycrystalline photoelectric conversion layer (4) and a metal thin film (3) covering one main surface of the polycrystalline photoelectric layer. Polycrystalline photoelectric conversion layer (4) has an average thickness in the range from 0.5 to 20 $\mu$m and at least one of main surfaces of polycrystalline photoelectric conversion layer (4) has a textured surface structure. The textured structure has fine unevenness with level differences smaller than half of the thickness of polycrystalline photoelectric conversion layer (4) and substantially in the range from 0.05 to 3 $\mu$m.

11 Claims, 6 Drawing Sheets

THIN FILM PHOTOELECTRIC TRANSDUCER

This application is the national phase under 35 U.S.C. §371 of PCT International Application No. PCT/JP98/00556 which has an International filing date of Feb. 12, 1998 which designated the United States of America.

1. Technical Field

The present invention relates generally to improvement in conversion efficiency of a thin film photoelectric converter, and particularly to improvement in photoelectric conversion efficiency of a polycrystalline thin film photoelectric conversion layer.

2. Background Art

Important factors concerning photoelectric materials for a photoelectric converter include an effective range of sensible wavelengths, light absorption coefficient, carrier mobility, lifetime of minority carriers and so on, all of which are important parameters of physical properties for improved efficiency of photoelectric converter. In the thin film photoelectric converter, absorption coefficient is particularly important. When a photoelectric conversion layer is formed of a thin film, light absorption is insufficient in longer wavelength range where absorption coefficient is low. Thus, an amount of photoelectric conversion is limited by the thickness of the photoelectric conversion layer. Therefore, a thin film photoelectric converter having high sensitivity and a high absorption coefficient in longer wavelength range is needed.

Recently, thin film photoelectric materials have been developed which are sensitive to light of a wide range of wavelengths and typically used in thin film polycrystalline silicon solar cells. In a thin film photoelectric material, however, the longer the wavelength of light, the smaller the absorption coefficient of the photoelectric material, and light absorption of the thin film as a whole is limited by the film thickness. Therefore, effective photoelectric conversion is difficult to be achieved over an entire range of sensible light wavelengths.

In view of the foregoing, an object of the present invention is to provide a thin film photoelectric converter capable of generating a large photoelectric current by producing a light scattering structure for preventing incident light escaping from the photoelectric conversion layer.

DISCLOSURE OF THE INVENTION

A thin film photoelectric converter of the present invention includes a substantially polycrystalline photoelectric conversion layer having first and second main surfaces and a metal thin film covering the second main surface; the polycrystalline photoelectric conversion layer being formed of a substantially polycrystalline silicon thin film with an average thickness in the range from 0.5 to 20 µm; at least the first main surface of the polycrystalline photoelectric conversion layer having a textured surface structure, and the textured structure having fine unevenness of which level differences are smaller than half of the average thickness of the polycrystalline photoelectric conversion layer and substantially in the range from 0.05 to 3 µm.

Preferably, crystallographic <110> direction of most crystal grains included in the polycrystalline photoelectric conversion layer is approximately parallel with a deviation angle less than 15° to the thickness direction of the polycrystalline photoelectric conversion layer.

Further, preferably the second main surface of the polycrystalline photoelectric conversion layer also has a textured surface structure and the textured structure has fine unevenness with level differences smaller than half of the thickness of polycrystalline photoelectric conversion layer and substantially in the range from 0.05 to 3 µm.

Still further, the polycrystalline photoelectric conversion layer is preferably formed of polycrystalline silicon of which crystallized volume fraction is 80% or larger, with hydrogen content of at least 0.1 atomic % and at most 30 atomic %.

Still further, at least a surface of the metal thin film facing the second main surface of the polycrystalline photoelectric conversion layer is preferably formed of a material selected from the group consisting of Ag, Au, Cu, Al and Pt, or an alloy including the same.

Still further, preferably, a transparent conductive or a transparent semiconductive buffer layer having a thickness in the range from 0.05 to 0.15 µm is interposed between the metal thin film and the polycrystalline photoelectric conversion layer.

Still further, the thin film photoelectric converter may include an amorphous photoelectric conversion layer of a substantially amorphous silicon thin film deposited on the first main surface of the polycrystalline photoelectric conversion layer.

BEST MODE FOR CARRYING OUT THE INVENTION

Figure 1:
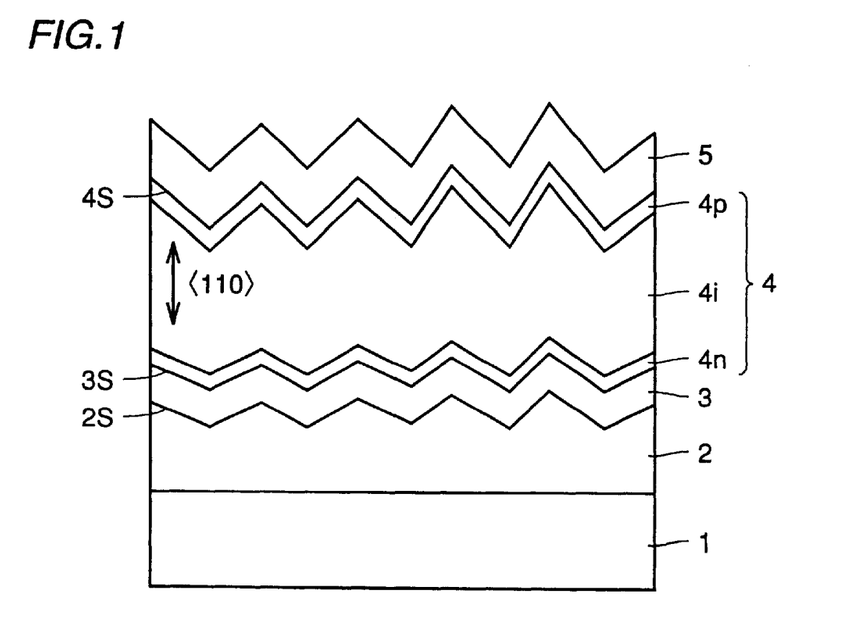
FIG. 1 is a schematic sectional view of a thin film photoelectric converter according to an embodiment of the present invention.

A thin film photoelectric converter of an embodiment of the present invention is schematically shown in section in FIG. 1. The thin film photoelectric converter includes, on a glass substrate 1, an underlying conductive layer 2, a reflecting metal layer 3, a polycrystalline photoelectric conversion layer 4, and a transparent conductive layer 5 sequentially formed in this order.

As underlying conductive layer 2, for example, an n+ type polycrystalline silicon layer with a high concentration of doped phosphorus can be deposited on glass substrate 1 by thermal CVD at a temperature of 500° C. or higher. Here, through suitable adjustment of thermal CVD conditions (e.g. temperature, pressure, flow rate of reactive gas and so on), a free surface 2S of underlying conductive layer 2 can be formed to have a textured structure with fine unevenness. The unevenness may have level differences in the range from 0.05 to 3 μm, for example.

Reflecting metal layer 3 can be formed by sputtering, for example, by using Ag target and utilizing RF(radio frequency) discharge in Ar gas at a pressure in the range from 0.1 to 50 mTorr. As for the target, materials other than Ag, such as Au, Cu, Al or Pt, or an alloy including at least one thereof can be used. Reflecting metal layer 3 thus formed has a free surface 3S having fine unevenness corresponding to the interface 2S with underlying conductive layer 2.

Substantially polycrystalline photoelectric conversion layer 4 can be formed by plasma CVD. Here, the term "substantially polycrystalline" means not only a completely polycrystalline material but also a polycrystalline material with small amorphous parts. Photoelectric conversion layer 4 can be formed, for example, of polycrystalline silicon of which crystallized volume fraction is 80% or higher. Polycrystalline photoelectric conversion layer 4 includes an n-type layer 4n, an i-type layer 4i and a p-type layer 4p deposited in this order. Plasma CVD can be performed, for example, at a pressure in the range from 0.01 to 5 Torr and at a temperature in the range from 50 to 550° C. Here, n-type layer 4n can be formed by plasma CVD using a mixed gas including, for example, phosphine, silane and hydrogen. Then, i-type layer 4i, which is a substantially intrinsic semiconductor, is deposited through plasma CVD using a mixed gas of hydrogen and a silane gas free from any conductivity type determining impurity. Finally, p-type semiconductor layer 4p is deposited through plasma CVD using a mixed gas including diborane, silane and hydrogen.

In most of the grains in polycrystalline photoelectric conversion layer 4 thus formed, <110> direction is approximately parallel to the thickness direction of the photoelectric conversion layer with a deviation angle of at most about 15°.

Polycrystalline photoelectric conversion layer 4 is grown to an average thickness in the range from about 0.5 to 20 μm and has a textured surface structure with fine unevenness on its free surface 4S. The unevenness on 4S includes V-shaped depressions and pyramid-shaped protrusions with level differences smaller than half of the average thickness of photoelectric conversion layer 4 and in the range from about 0.05 to 3 μm.

Further on polycrystalline photoelectric conversion layer 4, a layer 5 of transparent conductive oxide (TCO) such as indium tin oxide (ITO) is formed as a transparent electrode.

In polycrystalline photoelectric conversion layer 4 as shown in FIG. 1, rays of light are refracted at the uneven surface 4S, obliquely enter the layer, and then are reflected in multiple directions between interface 3S and uneven surface 4S, whereby effective optical path length is increased and, with the thin film, a large amount of light absorption can be obtained. The control of density and level differences of unevenness on interface 4S can be achieved through adjustment of plasma CVD conditions (temperature, pressure, gas flow rate, radio frequency power and so on) for polycrystalline photoelectric conversion layer 4, whereby making it possible to select a wavelength range of light preferentially scattered in photoelectric conversion layer 4. When light rays of longer wavelengths are preferentially scattered in polycrystalline photoelectric conversion layer 4, an amount of light absorption for light rays of longer wavelengths can be increased in particular.

When light enters a solid medium from atmosphere, a large scattering effect is caused by the strong interaction between light and the uneven surface structure having the level differences nearly equal to the wavelength. In a medium with a high refractive index n such as silicon, a wavelength of a propagated ray of light is reduced to 1/n. Hence, to scatter the light reaching interface 3S or uneven surface 4S in photoelectric conversion layer 4 and to again confine the light in photoelectric conversion layer 4, a preferable size of unevenness is in the range corresponding to 1/n times the light wavelength in the atmosphere. More preferably, the level differences of unevenness on interface 3S and uneven surface 4S are in the range from 0.08 to 1 μm.

When the polycrystalline silicon thin film is 2 μm in thickness, for example, among incident light, light rays of wavelengths more than about 500 nm will reach the back surface of the silicon thin film and are confined between the front and back surfaces by multiple reflection. Meanwhile, the wavelength of light which can be absorbed by silicon and thus substantially contribute to photoelectric conversion is about 1000 nm at the longest. As the refractive index n of silicon film is about 3.5 for the light rays of the wavelengths in the range from 500 to 1000 nm, a still more preferable size of unevenness on the textured surface for allowing a large light scattering effect is in the range from about 75 to 175% of 1/n times the wavelength, in other words, a size in the range from 0.1 to 0.5 μm is optimal.

Figure 2:
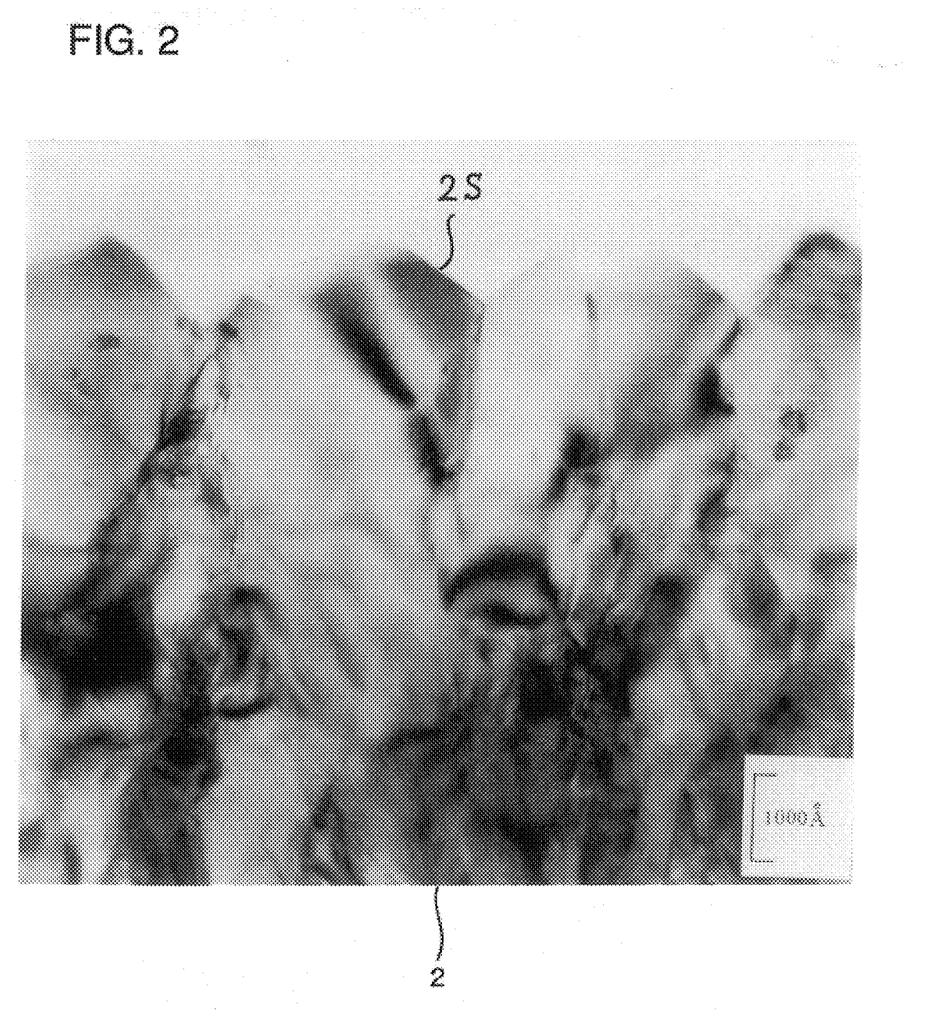
FIG. 2 is a transmission electron micrograph showing in section a crystal structure of an underlying conductive layer 2 as shown in FIG. 1.

In addition, a transparent conductive oxide layer can be formed as an underlying conductive layer 2. A photograph taken by a transmission electron microscope (TEM) is shown in FIG. 2, which shows a textured surface structure of $SnO_2$ doped with F and deposited on glass substrate 1 at 500° C. by thermal CVD at atmospheric pressure. Uneven surface 2S of underlying conductive layer 2 can be clearly observed in FIG. 2.

Figure 3:
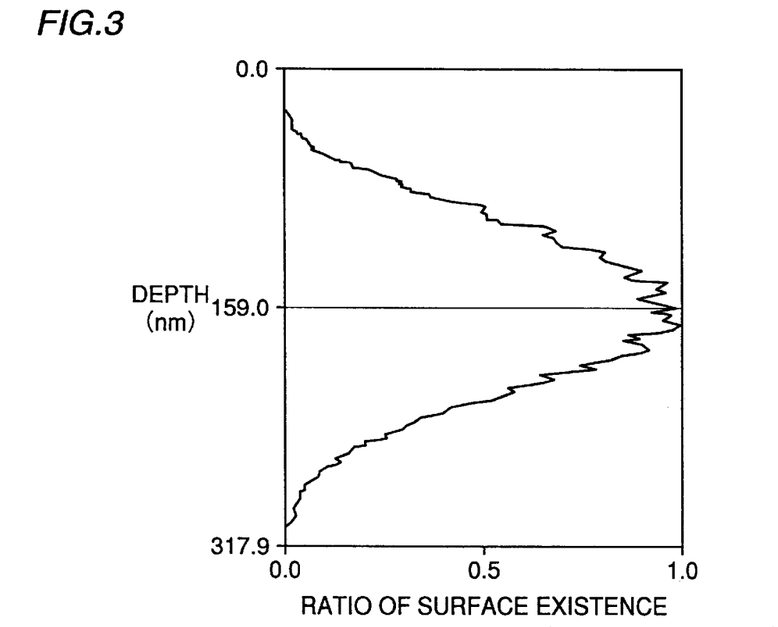
FIG. 3 is a graph showing distribution of unevenness in a textured surface structure of an underlying conductive layer as shown in FIG. 2.

A graph of FIG. 3 shows measurement results obtained by the atomic force microscope (AFM) regarding the distribution of unevenness on the textured surface structure of underlying conductive layer 2 as shown in FIG. 2. In this graph, the ordinate shows the depth (nm) measured with the highest point of the surface as a reference point (zero level), and the abscissa shows the relative frequency of existence of free surface at every level. The measurement was achieved by scanning a square area of 5000 nm by 5000 nm lengthwise and crosswise with a probe. It can be seen from the graph in FIG. 3 that the average level of uneven surface 2S is about 159 nm deep and the deepest level is about 318 nm deep from the referenced zero level.

Figure 4:
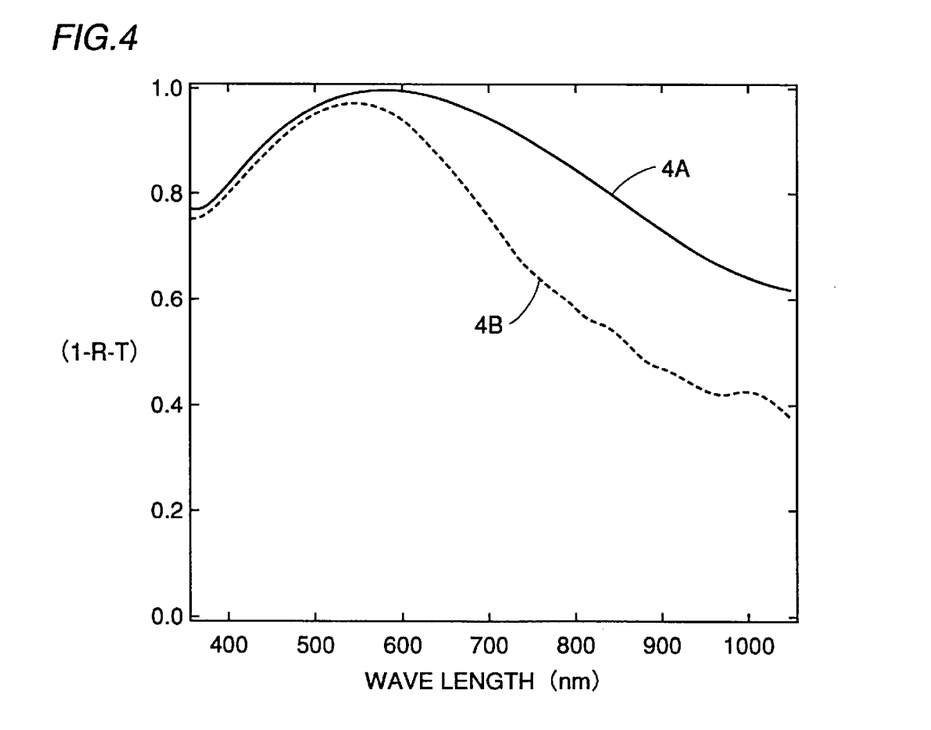
FIG. 4 is a graph of optical absorption characteristic of a thin film photoelectric converter as shown in FIG. 1.

An optical absorption characteristic of the thin film photoelectric converter as shown in FIG. 1 is plotted in a graph of FIG. 4. In this graph, the abscissa shows the wavelength (nm) of light and the ordinate shows absorption characteristic (1-R-T). Here, R represents diffuse reflectance and T represents transmittance of the photoelectric converter. Curve 4A shows the characteristics of the thin film photoelectric converter as shown in FIG. 1 and curve 4B shows the absorption characteristic of a thin film photoelectric converter similar to the one in FIG. 1 but not including a textured surface structure and reflecting metal layer 3. As clear from FIG. 4, it is understood that the thin film photoelectric converter having the light confinement structure as shown in FIG. 1 causes a large amount of light absorption in a near-infrared range.

Figure 5:
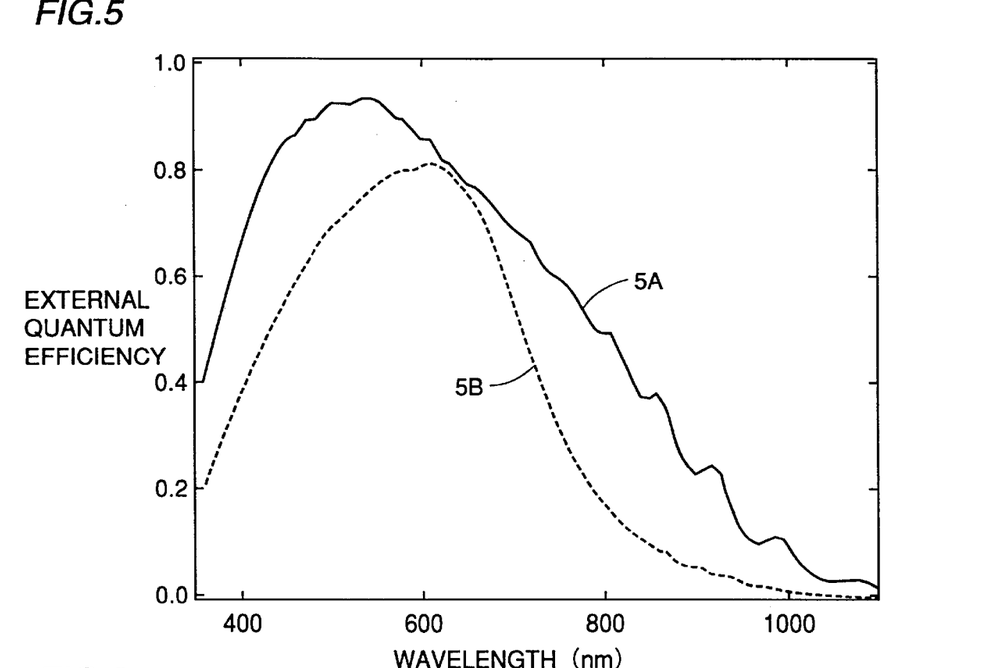
FIG. 5 is a graph of external quantum efficiency of a thin film photoelectric converter as shown in FIG. 1.

FIG. 5 shows external quantum efficiency of the thin film photoelectric converter having the light confinement structure as shown in FIG. 1. In FIG. 5, the abscissa represents the light wavelength (nm) and the ordinate represents the external quantum efficiency. Curve 5A shows the external quantum efficiency of the thin film photoelectric converter as shown in FIG. 1 and curve 5B shows the efficiency of a photoelectric converter similar to the one in FIG. 1 but not including a textured structure and reflecting metal film 3. As clear from FIG. 5, compared with the device not having the light confinement structure, the thin film photoelectric converter having the light confinement structure as shown in FIG. 1 exhibits a high external quantum efficiency in a wide range of wavelength from 360 to 1200 nm, and shows a particularly high external quantum efficiency of about 50% for light of long wavelength of 800 nm.

Figure 6:
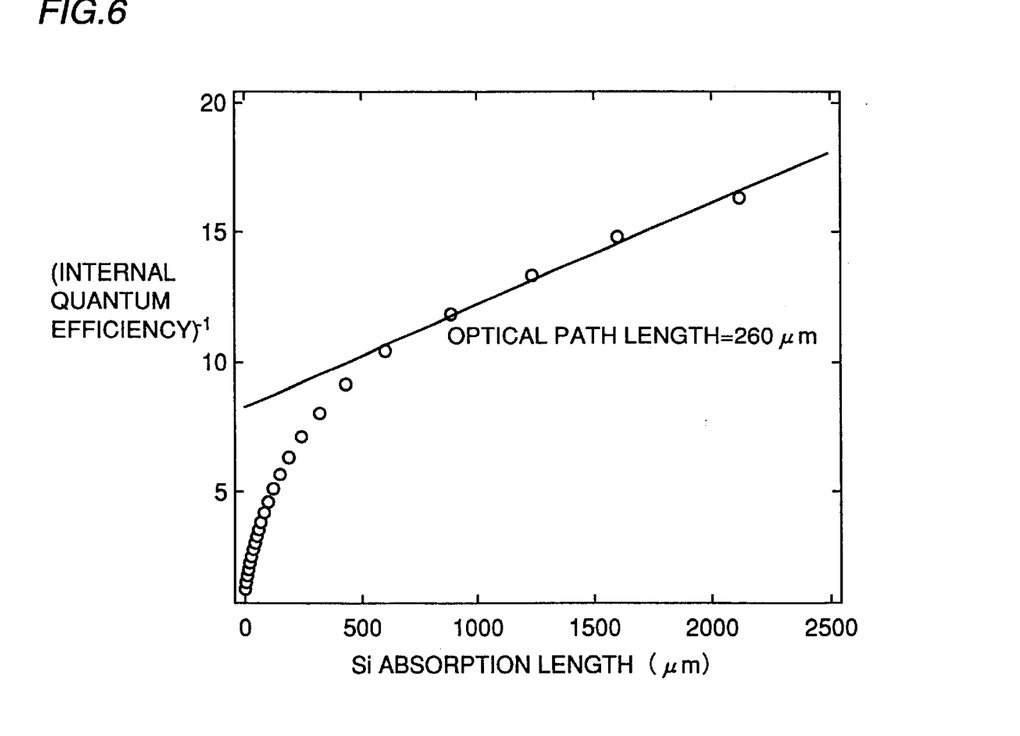
FIG. 6 is a graph referenced for deriving effective optical path length of a photoelectric conversion layer in a thin film photoelectric converter as shown in FIG. 1.

FIG. 6 shows measurement results of an optical characteristic of a photoelectric converter including polycrystalline photoelectric conversion layer 4 of 3 $\mu$m thickness having a textured surface structure. In FIG. 6, the abscissa represents the absorption length (nm) which is the inverse of absorption coefficient and the ordinate represents the inverse of internal quantum efficiency. The polycrystalline photoelectric conversion layer whose characteristic is shown in this graph has an effective optical path length of 260 $\mu$m. This means that the effective optical path length of the polycrystalline photoelectric conversion layer is increased to 120 times the film thickness. Here, the effective optical path length can be obtained as the inverse of slope of the line representing the relation between the absorption length derived from absorption coefficient of monocrystalline silicon and the inverse of internal quantum efficiency of photoelectric converter in the wavelength range more than 1000 nm.

As an example for the thin film photoelectric converter having the structure as shown in FIG. 1, on a TCO layer 2, an Ag thin film 3 of 300 nm thickness; a polycrystalline photoelectric conversion layer 4 of 2 $\mu$m thickness including 0.5 atomic % hydrogen; and a transparent electrode 5 of an 80 nm thick ITO layer were sequentially deposited. In the photoelectric converter thus formed, short-circuit current was 28 mA, open-circuit voltage was 0.45V and conversion efficiency was 9%.

Here, in the thin film photoelectric converter having the structure as shown in FIG. 1, if polycrystalline photoelectric conversion layer 4 formed by plasma CVD contains hydrogen in the range of at least 0.1 atomic % and at most 30 atomic %, the open-circuit voltage can be 0.45V or higher, and if it contains hydrogen in the range of at least 1 atomic % and at most 15 atomic %, the open-circuit voltage can be 0.5V or higher. Hydrogen atoms in the polycrystalline photoelectric conversion layer are believed to be capable of reducing defects in the photoelectric conversion layer. The hydrogen atom content can be evaluated by a secondary ion mass spectroscopy method.

In FIG. 1, though the thin film photoelectric converter includes underlying conductive layer 2, the underlying conductive layer is not essential to the present invention. If a relatively thick (about 300 to 500 nm) Ag layer 3 is directly deposited on glass substrate 1, the surface of the Ag layer 3 can be formed to have a textured surface with fine unevenness regardless of the absence of underlying layer 2. Such an Ag layer can be formed by vacuum evaporation at a substrate temperature of 200 to 300° C. In addition, considering the adhesion property between Ag layer 3 and glass substrate 1, it is preferable that a Ti thin film layer of about 50 nm thickness be interposed between Ag layer 3 and glass substrate 1. Such a Ti layer can be formed, for example, by sputtering or evaporation.

Figure 7:
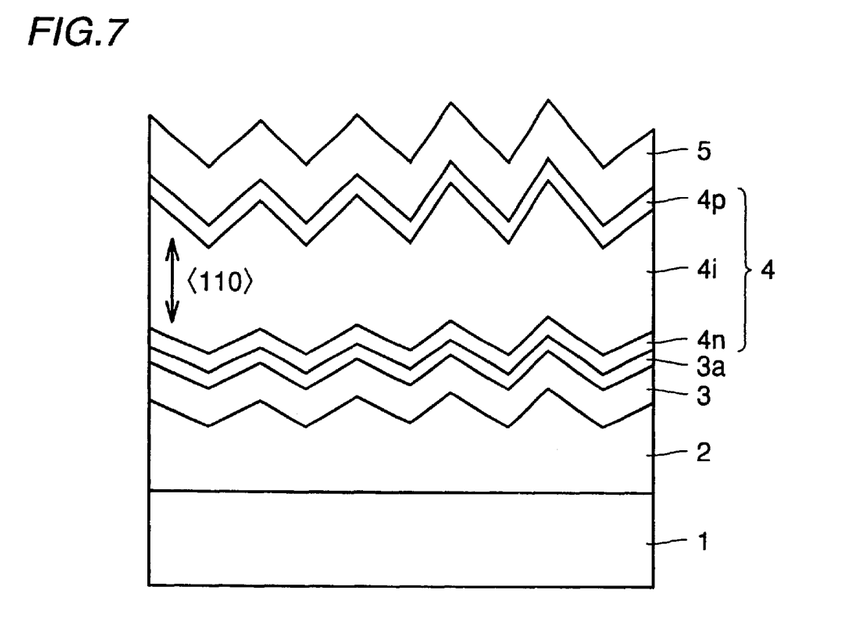
FIG. 7 is a schematic sectional view of a thin film photoelectric converter according to another embodiment of the present invention.

A schematic sectional view of a thin film photoelectric converter of a further embodiment of the present invention is shown in FIG. 7. The photoelectric converter of FIG. 7 is similar to the one in FIG. 1, but includes a transparent conductive buffer layer 3a between polycrystalline photoelectric conversion layer 4 and reflecting metal layer 3. Buffer layer 3a serves to reduce recombination of carriers and to enhance the effect of confinement of the light reflected from metal layer 3 in photoelectric conversion layer 4. For buffer layer 3a, at least one of transparent conductive materials ZnO, $In_2O_3$, $SnO_2$, and CdO or at least one of transparent semiconductor materials $Fe_2O_3$, TiO, ZnSe and ZnS can be employed. As an example, a thin film photoelectric converter having a structure as shown in FIG. 7 was formed by sequentially depositing on a TCO layer 2, an Ag thin film 3 of 300 nm thickness; a buffer layer 3a of a ZnO thin film of 80 nm thickness; a polycrystalline photoelectric conversion layer 4 of 2 $\mu$m thickness; and a transparent electrode 5 of an 80 nm thick ITO layer. In this photoelectric converter, short-circuit current was 30 mA, open-circuit voltage was 0.49V and conversion efficiency was 11%.

Figure 8:
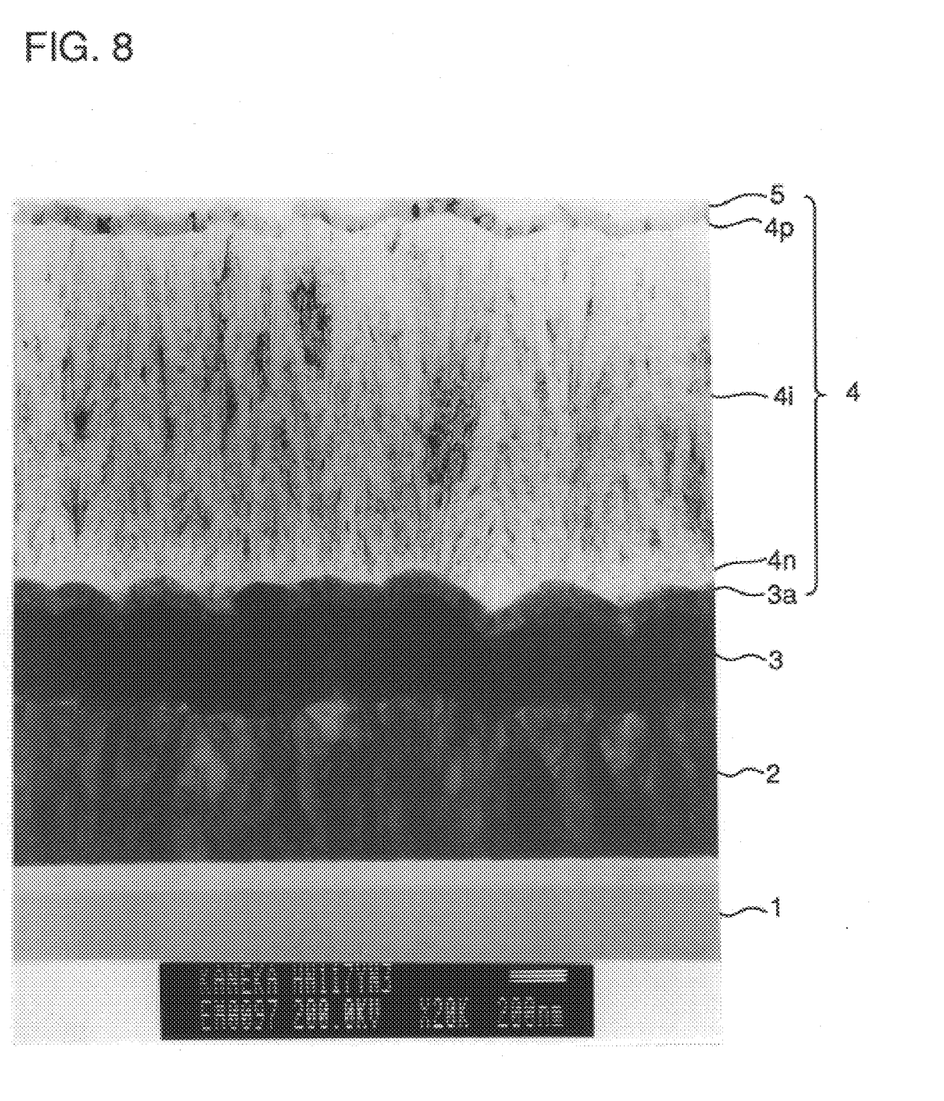
FIG. 8 is a transmission electron micrograph showing in section a thin film structure in a thin film photoelectric converter as shown in FIG. 7.

FIG. 8 shows an example of TEM photograph of the thin film photoelectric converter as shown in FIG. 7. A white segment in a bottom portion represents a length of 200 nm. In the TEM photograph of FIG. 8, not only a textured surface structure with fine unevenness but also columnar crystals extending in <110> direction in polycrystalline photoelectric conversion layer 4 can be observed. The <110> direction of the columnar crystals is approximately parallel to the thickness direction of the photoelectric conversion layer with a deviation angle of at most about 15°.

Figure 9:
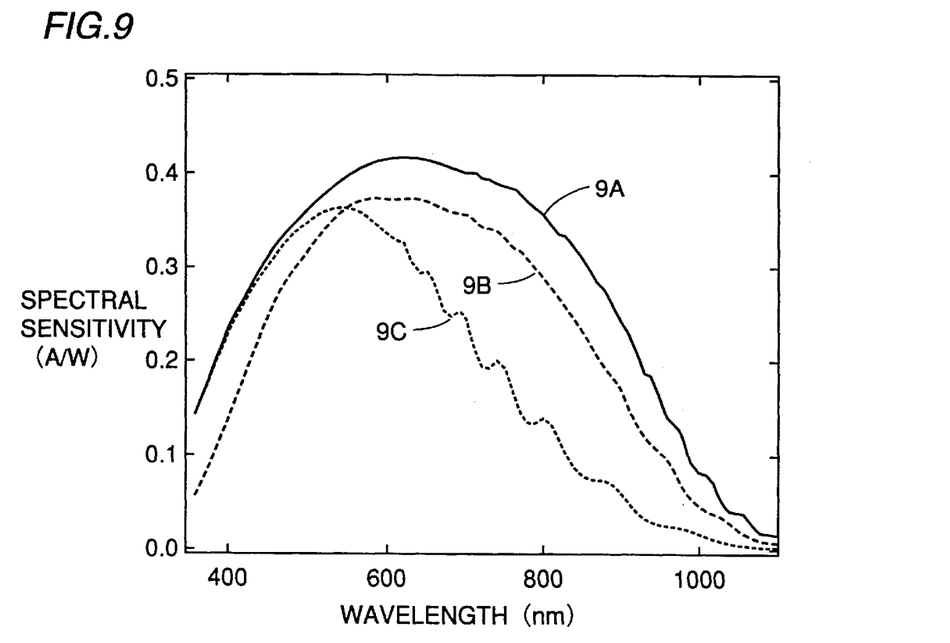
FIG. 9 is a graph illustrating effect of a buffer layer between a polycrystalline photoelectric conversion layer and a metal thin film on spectral sensitivity in each of some thin film photoelectric converters as shown in FIG. 7.

FIG. 9 is a graph showing an effect of the thickness of ZnO buffer layer 3a on spectral sensitivity of the thin film photoelectric converter as shown in FIG. 7. In this graph, the abscissa represents the wavelength (nm) of light and the ordinate represents the spectral sensitivity (A/W). Here, W represents energy of incident light in Watt, and A represents current supplied from the photoelectric converter in ampere. Incidentally, Ti was employed for underlying conductive layer 2. Curves 9A, 9B and 9C correspond to photoelectric converters having ZnO buffer layers 3a of 80 nm, 1000 nm and 0 nm in thickness, respectively. Comparison of curve 9A and curve 9C clearly shows significant increase in spectral sensitivity in the photoelectric converter having 80 nm thick ZnO buffer layer 3a, compared with that not having such a buffer layer. On the other hand, comparison of curves 9A and 9B clearly shows decrease in spectral sensitivity in the device having ZnO buffer layer 3a of an increased thickness of 1000 nm compared with the device having the 80 nm thick ZnO buffer layer. Therefore, the preferable range of the thickness of buffer layer 3a is from 0.005 to 0.15 $\mu$m.

Figure 10:
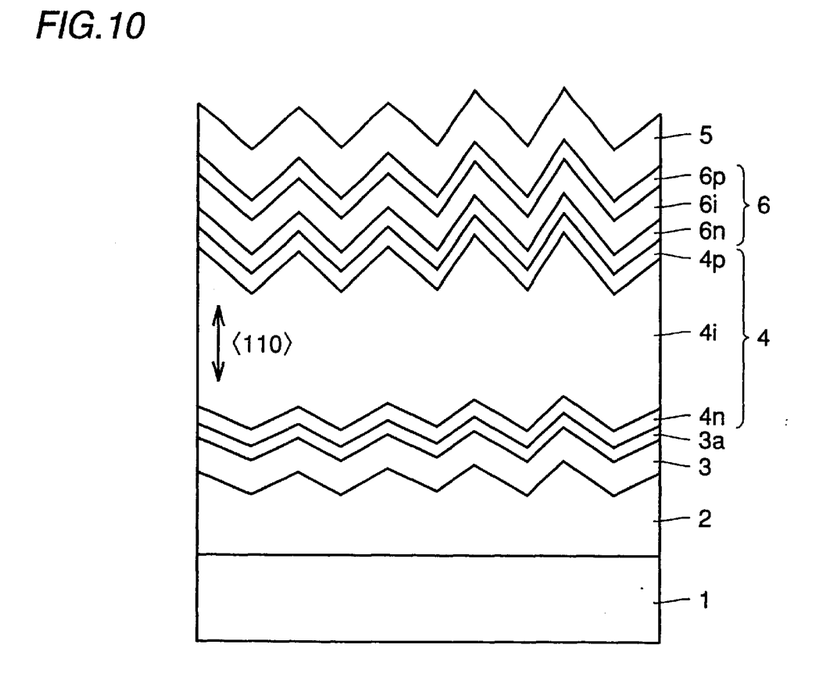
FIG. 10 is a schematic sectional view of a thin film photoelectric converter according to a further embodiment of the present invention.

FIG. 10 is a schematic sectional view of a thin film photoelectric converter according to a still further embodiment of the present invention. The photoelectric converter of FIG. 10, though similar to the one in FIG. 7, includes an amorphous photoelectric conversion layer 6 interposed between polycrystalline photoelectric conversion layer 4 and transparent electrode layer 5. In other words, the thin film photoelectric converter of FIG. 10 is a tandem type thin-film photoelectric converter having amorphous photoelectric conversion layer 6 formed on polycrystalline photoelectric conversion layer 4. Amorphous photoelectric conversion layer 6 includes an n-type amorphous silicon layer 6n, a substantially intrinsic amorphous silicon layer 6i and a p-type amorphous silicon layer 6p. Similarly as in the photoelectric converter of FIG. 7, a tandem thin film photoelectric converter was formed which included a reflecting metal layer 3 of a 300 nm thick Ag thin film; a buffer layer 3a of an 80 nm thick ZnO thin film; polycrystalline photoelectric conversion layer 4 of 2 μm thickness including 0.5 atomic % hydrogen; a 0.4 μm thick amorphous photoelectric conversion layer 6; and a transparent electrode 5 of an 80 nm thick ITO layer.

In the tandem photoelectric converter, short-circuit current was 13.5 mA, open-circuit voltage was 1.4V and conversion efficiency was 13.5%. Compared with the thin film photoelectric converter of FIG. 7, in the tandem thin film photoelectric converter of FIG. 10, the short-circuit current decreases and the open-circuit voltage increases. In addition, as light rays of short wavelengths are efficiently absorbed by amorphous photoelectric conversion layer 6 while light rays of longer wavelengths can be absorbed by polycrystalline photoelectric conversion layer 4, the photoelectric conversion efficiency is greatly improved.

Industrial Applicability

As can be seen from the foregoing, the present invention can provide a thin film photoelectric converter with an improved light absorption coefficient especially in the longer wavelength range. With this thin film photoelectric converter, large short-circuit current, high open-circuit voltage and high photoelectric conversion efficiency can be obtained.

What is claimed is:

1. A thin film photoelectric converter comprising:
   a polycrystalline photoelectric conversion layer including first and second main surfaces; and
   a metal thin film covering said second main surface;
   said polycrystalline photoelectric conversion layer being formed of a polycrystalline silicon thin film and having an average thickness in the range from 0.5 to 20 μm;
   said polycrystalline photoelectric conversion layer comprising grains with a <110> direction and wherein said <110> direction of the majority of said grains in said polycrystalline photoelectric conversion layer is approximately parallel to the direction of said thickness with a deviation angle of at most 15°; and
   at least said first main surface including a textured surface structure, the textured structure having fine unevenness with level differences smaller than half of said average thickness and in the range from 0.05 to 3 μm.

2. The thin film photoelectric converter according to claim 1, wherein said second main surface has a textured surface structure and the textured structure includes fine unevenness with level differences smaller than half of said average thickness and in the range from 0.05 to 3 μm.

3. The thin film photoelectric converter according to claim 1, wherein said polycrystalline photoelectric conversion layer is polycrystalline silicon having crystallized volume fraction of at least 80% and hydrogen content of at least 0.1 atomic % and at most 30 atomic %.

4. The thin film photoelectric converter according to claim 1, wherein said polycrystalline photoelectric conversion layer has an average thickness in the range from 1 to 10 μm, and the textured surface structure of at least one of said first and second main surfaces has fine unevenness with level differences in the range from 0.08 to 1 μm.

5. The thin film photoelectric converter according to claim 4, wherein the textured surface structure of at least one of said first and second main surfaces has fine unevenness with level differences in the range from 0.1 to 0.5 μm.

6. The thin film photoelectric converter according to claim 1, wherein at least a surface of said metal thin film facing said polycrystalline photoelectric conversion layer is formed of a material selected from the group consisting of Ag, Au, Cu, Al and Pt, or an alloy thereof.

7. The thin film photoelectric converter according to claim 1, wherein a transparent conductive or a transparent semiconductive buffer layer having a thickness in the range from 0.005 to 0.15 μm is interposed between said metal thin film and said polycrystalline photoelectric conversion layer.

8. The thin film photoelectric converter according to claim 7, wherein said buffer layer includes a material selected from the group consisting of ZnO, $In_2O_3$, $SnO_2$, $Fe_2O_3$, TiO, ZnS and ZnSe.

9. The thin film photoelectric converter according to claim 1, wherein said polycrystalline photoelectric conversion layer with said textured surface structure has an effective optical path length of at least 10 times said average thickness.

10. The thin film photoelectric converter according to claim 1, wherein said polycrystalline photoelectric conversion layer with said textured surface structure has external quantum efficiency of at least 50% for light with wavelength of 800 nm.

11. The thin film photoelectric converter according to claim 1 further comprising an amorphous photoelectric conversion layer of an amorphous silicon thin film deposited on said first main surface of said polycrystalline photoelectric conversion layer.

* * * * *